(12) United States Patent
Aigner et al.

(10) Patent No.: US 6,534,900 B2
(45) Date of Patent: Mar. 18, 2003

(54) PIEZORESONATOR

(75) Inventors: Robert Aigner, München (DE); Stephan Marksteiner, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/789,342

(22) Filed: Feb. 20, 2001

(65) Prior Publication Data
US 2001/0017504 A1 Aug. 30, 2001

(30) Foreign Application Priority Data
Feb. 18, 2000 (DE) .......................... 100 07 577

(51) Int. Cl.[7] .............................................. H01L 41/08
(52) U.S. Cl. ..................... 310/326; 310/331; 310/366
(58) Field of Search ................. 310/326, 327, 310/331, 366

(56) References Cited

U.S. PATENT DOCUMENTS

| | | | | |
|---|---|---|---|---|
| 5,212,988 A | * | 5/1993 | White et al. ................. 73/599 |
| 5,446,306 A | | 8/1995 | Stokes et al. ................ 257/416 |
| 5,587,620 A | | 12/1996 | Ruby et al. .................. 310/346 |
| 5,873,154 A | * | 2/1999 | Ylilammi et al. ............ 29/25.35 |
| 5,936,150 A | * | 8/1999 | Korbin et al. ............... 73/24.06 |
| 5,945,770 A | * | 8/1999 | Hanafy ........................ 310/322 |
| 6,060,818 A | * | 5/2000 | Ruby et al. .................. 310/363 |
| 6,204,737 B1 | * | 3/2001 | Ella ............................. 333/187 |
| 6,287,342 B1 | * | 8/2001 | Ella ............................. 333/189 |
| 6,292,143 B1 | * | 9/2001 | Romanofsky ........... 343/700 MS |
| 6,336,366 B1 | * | 1/2002 | Thundat et al. ............. 310/331 |
| 2001/0017504 A1 | * | 8/2001 | Aigner et al. ............... 310/330 |

FOREIGN PATENT DOCUMENTS

| | | | |
|---|---|---|---|
| EP | 0 609 555 A2 | 8/1994 | ............. H03H/9/17 |
| EP | 0865157 A2 | 9/1998 | ............. H03H/9/17 |
| EP | 0 949 756 A2 | 10/1999 | ............. H03H/9/58 |
| EP | 0 962 999 A2 | 12/1999 | ............. H01P/01/12 |
| JP | 2000-30595 | * 1/2000 | ............. 310/331 |
| WO | WO 99/59244 | 11/1999 | ............. H03H/9/00 |

* cited by examiner

Primary Examiner—Thomas M. Dougherty
(74) Attorney, Agent, or Firm—Laurence A. Greenberg; Werner H. Stemer; Ralph E. Locher

(57) ABSTRACT

A thin film piezoresonator, which can be tuned over a wide range of RF frequencies, includes a piezo layer between a first electrode layer and a second electrode layer. An electroactive layer of an electrostrictive material, which experiences a mechanical deformation when an electrical voltage is applied, is disposed between a third electrode layer and the second electrode layer.

14 Claims, 1 Drawing Sheet

PIEZORESONATOR

BACKGROUND OF THE INVENTION

Field of the Invention

The present invention relates to a thin film piezoresonator which, in particular, can be used as a filter in BAW components.

In BAW (bulk acoustic wave) components, a piezoelectric effect which occurs in specific materials is used to generate a mechanical stress in the material through the use of applied electrical voltages. Conversely, mechanical deformations in a piezoelectric material produce electrical voltages. Layers of piezoelectric material, referred to below as piezo layers, can be excited into acoustic oscillations in the range of GHz frequencies if they have a suitable thickness in the range of a few micrometers and are disposed between electrode layers. If the piezo layer is insulated acoustically from the environment, standing waves can be produced, and the component can be operated at resonance. One application of that principle is known from quartz clocks, crystal filters and BAW filters. Acoustic insulation can be provided by applying the piezo layer as a thin membrane, so that it is surrounded all around by air. Another possibility is to use acoustic Bragg reflectors as a stack of layers with a thickness of one quarter wavelength. The individual layers of the Bragg reflector in that case are formed of materials of different acoustic impedances. The thickness of the piezo layer substantially determines the resonant frequency. Therefore, fluctuations in layer thickness during a manufacturing process have a considerable effect on the resonant properties of a BAW component. European Patent Application EP 0 865 157 A2, corresponding to U.S. Pat. No. 5,872,493, describes a BAW filter with two piezoelectric layers of similar materials and thicknesses, disposed as a SCF (stacked crystal filter).

In the case of a thin film piezoresonator, the resonant frequency can be retuned by a structured layer being applied to the piezo layer. Instead of structuring a single layer, a series of a plurality of unstructured layers of different thicknesses can be applied, in order to suppress one or more resonant frequencies. The resonant frequency can be shifted through the use of connected capacitances or an applied D.C. voltage. However, the tuning range is very low in that case and barely adequate for practical purposes. Even when very high D.C. voltages are applied, the relative length expansion of typical materials used for piezo layers (e.g. ZnO, AlN, PbZrTi) is less than 0.1%. Materials with more efficient length expansion, such as the polymer PVDF, are unsuitable in the range of high frequencies.

SUMMARY OF THE INVENTION

It is accordingly an object of the invention to provide a piezoresonator, which overcomes the hereinafore-mentioned disadvantages of the heretofore-known devices of this general type and which can be tuned over a wide range in the range of radio frequencies.

With the foregoing and other objects in view there is provided, in accordance with the invention, a thin film piezoresonator, comprising first, second and third electrode layers. A piezo layer is disposed between the first and second electrode layers and an electroactive or electrostrictive layer is disposed between the second and third electrode layers.

The piezoresonator according to the invention uses a layer of at least predominantly electrostrictive electroactive materials which is referred to below as an electroactive layer, in order to tune the resonant frequency of a piezoelectric BAW resonator. An electroactive material is understood to be a material which exhibits the piezoelectric effect or its converse, electrostriction, which is formed in a mechanical deformation of the electrostrictive material occurring when an electrical voltage is applied. The effect of electrostriction is used, for example, in a quartz crystal which is set into resonant oscillations by applying an alternating electrical voltage. Conversely, the piezoelectric effect permits an electrical voltage to be tapped off if the piezoelectric material is deformed suitably. There are purely electrostrictive materials, in which this converse effect does not occur or occurs to only a very slight extent. Therefore, such materials do not generate any electrical voltage in the event of a deformation. This property is possessed by some nonpolar ceramics, in particular PMN (lead magnesium niobate) and a series of polymers (for example polyvinylidene fluoride hexafluoropropylene [P(VF2-HFP)]). Such materials, which are electrostrictive in this sense, are preferably used as the electroactive layer in the piezoresonator according to the invention. The effect of electrostriction is nonlinear to a great extent. The mechanical deformation depends on the square of the existing electrical field. In the piezoresonator according to the invention, the piezo layer is connected to an electroactive layer, preferably one made of a purely electrostrictive material, which contracts in the vertical direction, that is to say is thinned, when a D.C. voltage is applied. This changes the resonant frequency of the layer stack. The piezo layer is disposed between electrode layers. The electroactive layer is disposed on one of these electrodes on the side facing away from the piezo layer, and has a third electrode layer for the application of the D.C. voltage. Other features which are considered as characteristic for the invention are set forth in the appended claims.

Although the invention is illustrated and described herein as embodied in a piezoresonator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
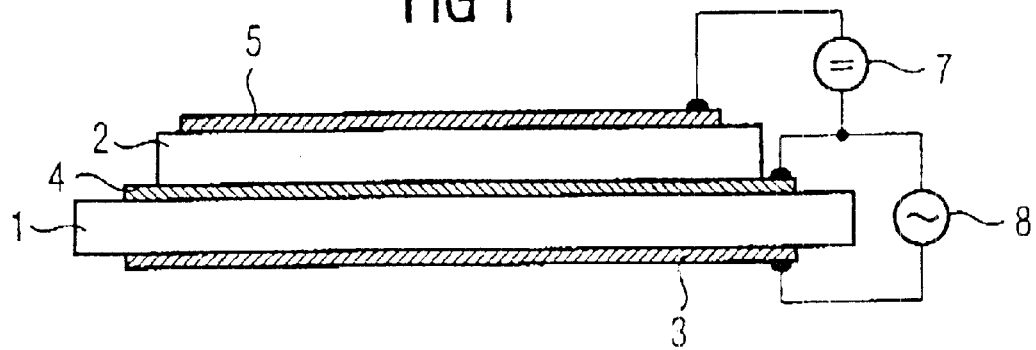
FIGS. 1, 2 and 3 are diagrammatic, cross-sectional views of respective embodiments of a piezoresonator according to the invention.

Referring now to the figures of the drawings in detail and first, particularly, to FIG. 1 thereof, there is seen a cross section of a basic structure of a piezoresonator according to the invention. A piezo layer 1 is located between a first electrode layer 3 and a second electrode layer 4. An alternating voltage 8, which is an RF signal, is applied to these electrode layers. An electroactive layer 2 is located on the second electrode layer 4 and a third electrode layer 5 is located on the electroactive layer 2. A D.C. voltage 7, with which the tuning of the resonant frequency is carried out, is applied to the second electrode layer 4 and the third electrode layer 5.

Figure 2:
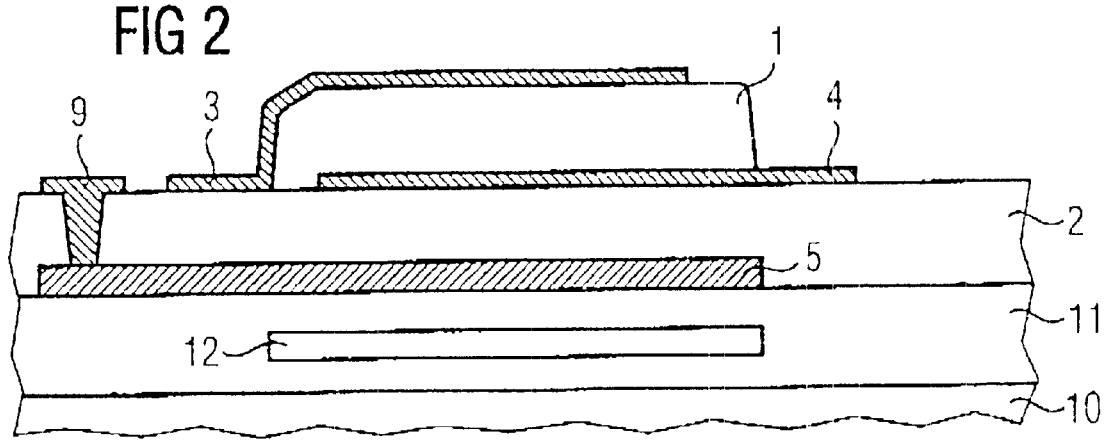

FIG. 2 shows an exemplary embodiment in which the piezo layer 1 is disposed above the electroactive layer 2. The component is located on a substrate 10 and is insulated from it acoustically by a Bragg reflector. This Bragg reflector includes a series of layers of materials which alternately have a low and a high acoustic impedance. In the example shown in cross section in FIG. 2, a layer 12 of material of high acoustic impedance is embedded in a layer 11 of a material of low acoustic impedance. The third electrode layer 5 provided for the application of the D.C. voltage forms a further layer of a material of high acoustic impedance. The electroactive layer 2 itself again acts as a layer of low acoustic impedance, so that in this example the piezo layer 1 is insulated acoustically from the substrate 10 by a series of three layers of low acoustic impedance alternating with layers of high acoustic impedance. In this example, the third electrode layer 5 is disposed between the layer 11 of a material of low acoustic impedance and the electroactive layer 2. In order to permit the electrical connection of the third electrode layer 5, the latter has an electrical contact 9 thereon which is connected through a contact hole.

Figure 3:
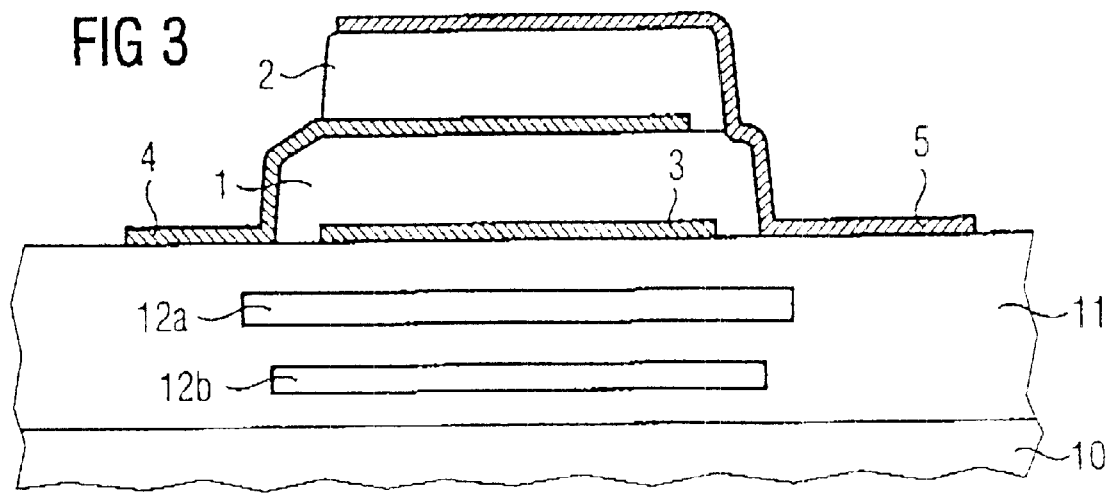

In the exemplary embodiment illustrated in FIG. 3, there is a Bragg reflector which is formed by two layers 12a, 12b of a material of high acoustic impedance, which are embedded at a distance from each other in a layer 11 of a material of low acoustic impedance. The first electrode layer 3 is located on the layer 11 and the piezo layer 1 is disposed on the first electrode layer 3. In this case, the electroactive layer 2 is disposed on that side of the piezo layer 1 which faces away from the substrate 10, between the second electrode layer 4 and the third electrode layer 5.

In the exemplary embodiment according to FIG. 2 as well, there may be an electroactive layer on the side of the piezo layer 1 facing away from the substrate 10, in addition to the electroactive layer 2 already shown therein. A fourth electrode layer must be present in that case in order to apply the D.C. voltage to the further electroactive layer. It is then possible to use the fourth electrode layer to bring about the change in the resonant frequency through the use of electroactive layers present on both sides of the piezo layer 1. Tuning of the resonant frequency may be improved in this way. The result is also additional possibilities for optimizing the structure of the layer thicknesses.

It is particularly advantageous to use a purely electrostrictive material, which does not exhibit the piezoelectric effect, for the electroactive layer. This means that deformation of the electroactive layer does not have any effect on the RF signal applied to the piezo layer. Losses which are suffered by the useful RF signal due to displacement currents occurring in the electroactive layer therefore do not have any distorting back-effect on the RF signal.

An effectively tunable RF filter can be manufactured in a simple way by using the piezoresonator according to the invention. The basic frequency for a simple resonator with thin electrode layers is given by a standing wave having a wavelength which is equal to half the layer thickness of the piezo layer. Additional layers or thicker electrode layers increase the overall layer thickness which is effective for the resonator and reduce the resonant frequency. A thinner piezo layer with thicker electrode layers or with additional layers in combination reduces the bandwidth of the resonator. Therefore, the properties of the filter can be set within wide limits by setting the respective layer thicknesses. In this case it is not necessary to achieve the greatest possible bandwidth in every case due to the possibility of tuning the basic frequency. The possible applications of the piezoresonator according to the invention are therefore significantly more comprehensive than the conventional RF filters having a fixed resonant frequency. In addition, when used in components which are provided for a fixed frequency, the piezoresonator according to the invention may be advantageous, since the frequency can very easily be retuned to a desired value, irrespective of fabrication tolerances or temperature fluctuations. It is sufficient for this purpose if the simplified embodiment according to FIG. 2 is used, in which the electroactive layer and the third electrode layer 5 form part of the Bragg reflector effecting the acoustic insulation with respect to the substrate 10. However, by using this simple structure, a tuning range of approximately 2% can already be achieved, which is entirely adequate for retuning a fixed frequency. The thickness of the electroactive layer 2 in this case is preferably approximately one-quarter of the wavelength of the resonance.

In addition, it is possible to make the layer thickness of the electroactive layer greater than one-quarter of the wavelength, and to operate the resonator in a higher inherent oscillation mode. As a result, although the bandwidth of the resonance is reduced somewhat, the tunable range gains considerably in terms of bandwidth. If an RF signal without a D.C. component is applied to the electroactive layer, the layer structure begins to oscillate at twice the resonant frequency. This is because the longitudinal expansion depends on the square of the voltage. These oscillations are coupled across into the piezo layer and can be registered at the electrode layers applied to the piezo layer. This effect is particularly pronounced at specific frequencies due to the resonant properties of the layer structure. Frequency doubling or impedance matching can therefore be achieved at these frequencies with the layer structure according to the invention.

The electrode layers can be materials such as those which are known in principle from metallizations on semiconductor components, for example aluminum, tungsten, platinum or molybdenum. Before the application of the remaining layers, if appropriate, layers are applied to the electrode layers which facilitate the application or growth of the further layers. The substrate 10 is typically made of silicon, glass or gallium arsenide. The materials of low acoustic impedance are, for example, $SiO_2$ or $Si_3N_4$. The materials of high acoustic impedance are, for example, tungsten or molybdenum. AlN, ZnO, PZT ceramic (PbZrTi) or modifications of these materials can be used for the piezo layer. The electroactive layer is preferably PMN (lead magnesium niobate) which may, for example, be sp uttered on or vapor-deposited (by CVD, chemical vapor deposition) or manufactured through the use of the so-called sol-gel process. In addition, a polymer such as the aforementioned P(VF2-HFP) can be used as the electroactive layer.

We claim:

1. A thin film piezoresonator, comprising:
   a first electrode layer;
   a second electrode layer;
   a third electrode layer;
   a piezo layer disposed between said first and second electrode layers;
   an electroactive layer disposed between said second and third electrode layers;
   said second and third electrode layers and said electroactive layer defining a layer stack, a layer plane, and a vertical direction along a line substantially perpendicular to said layer plane;
   said electroactive layer being formed of a material contracting said electroactive layer in said vertical direction when a D.C. voltage is applied between said second electrode layer and said third electrode layer to change a resonance frequency of said layer stack for tuning the piezoresonator; and a series of layers formed alternately of a material of low acoustic impedance and a material of high acoustic impedance, said piezo layer and said electroactive layer disposed on said series of layers.

2. The piezoresonator according to claim 1, wherein said piezo layer is a material selected from the group consisting of AlN, ZnO and a PZT ceramic (PbZrTi).

3. The piezoresonator according to claim 1, wherein said electroactive layer is a further layer of low acoustic impedance, and said third electrode layer is a further layer of high acoustic impedance.

4. The piezoresonator according to claim 1, wherein said piezo layer is a material selected from the group consisting of AlN, ZnO and a PZT ceramic (PbZrTi).

5. The piezoresonator according to claim 1, wherein said electroactive layer is a polymer.

6. A thin film piezoresonator, comprising:

a first electrode layer;

a second electrode layer;

a third electrode layer;

a piezo layer disposed between said first and second electrode layers;

an at least predominantly electrostrictive electro-active material layer disposed between said second and third electrode layers;

said second and third electrode layers and said at least predominantly electrostrictive electro-active material layer defining a layer stack, a layer plane, and a vertical direction along a line substantially perpendicular to said layer plane; and said at least predominantly electrostrictive electro-active material layer being formed of a material contracting said at least predominantly electrostrictive electro-active material layer in said vertical direction when a D.C. voltage is applied between said second electrode layer and said third electrode layer to change a resonance frequency of said layer stack for tuning the piezoresonator.

7. The piezoresonator according to claim 6, wherein said piezo layer is a material selected from the group consisting of AlN, ZnO and a PZT ceramic (PbZrTi).

8. The piezoresonator according to claim 6, including a series of layers formed alternately of a material of low acoustic impedance and a material of high acoustic impedance, said piezo layer and said at least predominantly electrostrictive electro-active material layer disposed on said series of layers.

9. The piezoresonator according to claim 8, wherein said electrostrictive layer is a further layer of low acoustic impedance, and said third electrode layer is a further layer of high acoustic impedance.

10. The piezoresonator according to claim 6, wherein said at least predominantly electrostrictive electro-active material layer is lead magnesium niobate.

11. The piezoresonator according to claim 6, wherein said at least predominantly electrostrictive electro-active material layer is a polymer.

12. A thin film piezoresonator, comprising:

a first electrode layer;

a second electrode layer;

a third electrode layer;

a piezo layer disposed between said first and second electrode layers;

an electroactive layer being formed of lead magnesium niobate disposed between said second and third electrode layers;

said second and third electrode layers and said electroactive layer defining a layer stack, a layer plane, and a vertical direction along a line substantially perpendicular to said layer plane; and said electroactive layer being formed of a material contracting said electroactive layer in said vertical direction when a D.C. voltage is applied between said second electrode layer and said third electrode layer to change a resonance frequency of said layer stack for tuning the piezoresonator.

13. The piezoresonator according to claim 12, including a series of layers formed alternately of a material of low acoustic impedance and a material of high acoustic impedance, said piezo layer and said electroactive layer disposed on said series of layers.

14. The piezoresonator according to claim 13, wherein said electroactive layer is a further layer of low acoustic impedance, and said third electrode layer is a further layer of high acoustic impedance.

* * * * *